(12) United States Patent
Won et al.

(10) Patent No.: US 10,937,944 B2
(45) Date of Patent: Mar. 2, 2021

(54) PIEZOELECTRIC ELEMENT INCLUDING MESOPOROUS PIEZOELECTRIC THIN FILM

(71) Applicant: Samsung Display Co., Ltd., Yongin-si (KR)

(72) Inventors: Byeong-Hee Won, Hwaseong-si (KR); Yi Joon Ahn, Seoul (KR); Won Sang Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 566 days.

(21) Appl. No.: 15/845,202

(22) Filed: Dec. 18, 2017

(65) Prior Publication Data

US 2018/0123020 A1 May 3, 2018

Related U.S. Application Data

(62) Division of application No. 14/742,424, filed on Jun. 17, 2015, now abandoned.

(30) Foreign Application Priority Data

Dec. 4, 2014 (KR) .................. 10-2014-0172898

(51) Int. Cl.
*H01L 41/193* (2006.01)
*H01L 41/113* (2006.01)
(Continued)

(52) U.S. Cl.
CPC ........ *H01L 41/193* (2013.01); *H01L 41/0825* (2013.01); *H04R 17/005* (2013.01);
(Continued)

(58) Field of Classification Search
CPC ......... H02J 50/15; H02J 50/12; H01L 41/193; H01L 41/0825; H01L 41/113;
(Continued)

(56) References Cited

U.S. PATENT DOCUMENTS 3,792,204 A 2/1974 Murayama et al.
3,894,198 A 7/1975 Murayama et al.
(Continued)

FOREIGN PATENT DOCUMENTS

JP 2017-050709 3/2017
KR 10-2002-0012650 2/2002
(Continued)

OTHER PUBLICATIONS

Non-Final Office Action dated Sep. 22, 2017, in U.S. Appl. No. 14/742,424.
(Continued)

*Primary Examiner* — Edgardo San Martin
(74) *Attorney, Agent, or Firm* — H.C. Park & Associates, PLC (57) ABSTRACT

A piezoelectric element includes: an upper electrode having acoustic transparency; a lower electrode; and a diaphragm disposed between the upper electrode and the lower electrode and configured of a mesoporous piezoelectric thin film. The upper electrode, the lower electrode, and the diaphragm are electrically insulated from one another.

14 Claims, 8 Drawing Sheets

(51) Int. Cl.

| | | |
|---|---|---|
| *H02N 2/18* | (2006.01) | |
| *H04R 17/00* | (2006.01) | |
| *H01L 41/08* | (2006.01) | |
| *H04R 17/02* | (2006.01) | |
| *H04R 19/02* | (2006.01) | |
| *H04R 19/04* | (2006.01) | |
| *H04R 23/02* | (2006.01) | |
| *H04R 19/00* | (2006.01) | |

(52) U.S. Cl.
CPC ........... *H04R 17/025* (2013.01); *H04R 19/02* (2013.01); *H04R 19/04* (2013.01); *H04R 23/02* (2013.01)

(58) Field of Classification Search
CPC ... H01L 41/125; H04R 17/005; H04R 17/025; H04R 19/02; H04R 19/04; H04R 23/02; H02N 2/18; H02N 2/186
See application file for complete search history.

(56) References Cited

U.S. PATENT DOCUMENTS

| | | | |
|---|---|---|---|
| 3,894,199 A | | 7/1975 | Tamura et al. |
| 3,942,029 A | | 3/1976 | Kawakami et al. |
| 5,889,383 A | * | 3/1999 | Teich ............... H02J 7/00 320/107 |
| 6,175,636 B1 | | 1/2001 | Norris et al. |
| 6,525,996 B1 | * | 2/2003 | Miyazawa ........ G04C 10/04 368/204 |
| 6,798,716 B1 | * | 9/2004 | Charych ............ H02J 50/15 367/119 |
| 7,446,459 B2 | | 11/2008 | Xu et al. |
| 7,668,323 B2 | | 2/2010 | Miyazaki |
| 8,666,094 B2 | | 3/2014 | Matsuzawa |
| 8,680,751 B2 | | 3/2014 | Wang et al. |
| 8,803,406 B2 | | 8/2014 | Lee et al. |
| 8,983,099 B2 | | 3/2015 | Takano et al. |
| 9,525,311 B2 | * | 12/2016 | Menegoli ............ H02J 50/30 |
| 10,147,870 B2 | * | 12/2018 | Zhang ............... H01L 41/047 |
| 2010/0164433 A1 | * | 7/2010 | Janefalkar ......... H02J 50/40 320/115 |
| 2010/0234924 A1 | * | 9/2010 | Willis .................. A61N 1/3787 607/63 |
| 2012/0051564 A1 | | 3/2012 | Liou et al. |
| 2012/0286625 A1 | | 11/2012 | Cherian |
| 2013/0178915 A1 | * | 7/2013 | Radziemski ......... A61M 1/127 607/61 |
| 2017/0346341 A1 | * | 11/2017 | Jeong ................ H02M 5/458 |

FOREIGN PATENT DOCUMENTS

| | | |
|---|---|---|
| KR | 10-0951592 | 4/2010 |
| KR | 10-2010-0108363 | 10/2010 |
| KR | 10-1292195 | 1/2013 |
| KR | 10-2013-0041086 | 4/2013 |
| KR | 10-2013-0041101 | 4/2013 |
| KR | 10-2013-0130600 | 12/2013 |
| WO | 2016/077560 | 5/2016 |

OTHER PUBLICATIONS

Yanchao Mao, et al., Sponge-Like Piezoelectric Polymer Films for Scalable and Intearatable Nanogenerators and Self-Powered Electronic Systems, Advanced Energy Materials, 2014, pp. 1-7.

Dajeng Chen, et al., Mesoporous Surface Cnntroi of PVDF Thin Fiims for Enhanced Piezoelectric Energy Generation, 216 Sensors and Actuators A 196-201 (Jun. 2, 2014).

Yanchao Mao, et al, Sponge-Like Piezoelectric Polymer Films for Scalable and Integratable Nanogenerators and Self-Powered Electronic Systems, Advanced Energy Materials, 2014, pp. 1-7.

* cited by examiner

PIEZOELECTRIC ELEMENT INCLUDING MESOPOROUS PIEZOELECTRIC THIN FILM

CROSS-REFERENCE TO RELATED APPLICATIONS

This application is a Divisional of U.S. patent application Ser. No. 14/742,424, filed on Jun. 17, 2015, and claims priority from and the benefit of Korean Patent Application No. 10-2014-0172898, filed on Dec. 4, 2014, which is hereby incorporated by reference for all purposes as if fully set forth herein.

BACKGROUND

Field

Exemplary embodiments relate to a piezoelectric element, and more particularly, to a multi-functional piezoelectric element capable of serving as a speaker, a microphone, a charging element, and the like.

Discussion of the Background

A piezoelectric element is an element which uses a piezoelectric phenomenon to generate an electrical signal. The piezoelectric phenomenon is a phenomenon in which a linear force is applied to a crystal plate to generate a positive charge and a negative charge in proportion to the force applied on both surfaces of the crystal plate.

However, the applied force needs to be strong to generate electric energy using the piezoelectric element, and therefore, although the piezoelectric element is used to generate power in shoes, lighters, sidewalks and crosswalks, and the like, it is hardly ever applied as a source of power generation for general mobile devices.

A type of microphone that receives a sound wave or an ultrasonic wave and generates an electrical signal depending on vibrations is known as a piezo-type microphone. However, a piezo-type microphone has lower and non-uniform voice band frequency characteristics when compared with a condenser-type microphone and thus has a considerably restricted range of applications.

Therefore, there is a technical difficulty in using the same piezoelectric element used for a microphone used in a mobile device as a charging element for power generation.

More technical effort is also required to additionally implement a speaker function in such a piezoelectric element.

The above information disclosed in this Background section is only for enhancement of understanding of the background of the invention and therefore it may contain information that does not form the prior art that is already known in this country to a person of ordinary skill in the art.

SUMMARY

Exemplary embodiments provide a piezoelectric element including a mesoporous piezoelectric thin film having advantages of providing a multi-functional piezoelectric element which serves as one of a speaker, a microphone, or a charging element, depending on an applied signal.

Additional aspects will be set forth in the detailed description which follows, and, in part, will be apparent from the disclosure, or may be learned by practice of the inventive concept.

According to exemplary embodiments a piezoelectric element includes: an upper electrode having acoustic transparency; a lower electrode; and a diaphragm disposed between the upper electrode and the lower electrode and constructed of a mesoporous piezoelectric thin film, wherein the upper electrode, the lower electrode, and the diaphragm are electrically insulated from one another.

According to exemplary embodiments a wireless charging system includes: a charging target device including a piezoelectric element which includes a diaphragm configured of a mesoporous piezoelectric thin film; and a charging device generating a vibration, wherein the piezoelectric element generates a current by the vibration which is generated by the charging device and the charging target device is charged using the current.

According to the exemplary embodiment of the present invention, it is possible to provide the multi-functional piezoelectric element which functions as one of a speaker, a microphone, and a charging element, depending on the applied signal.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1A:
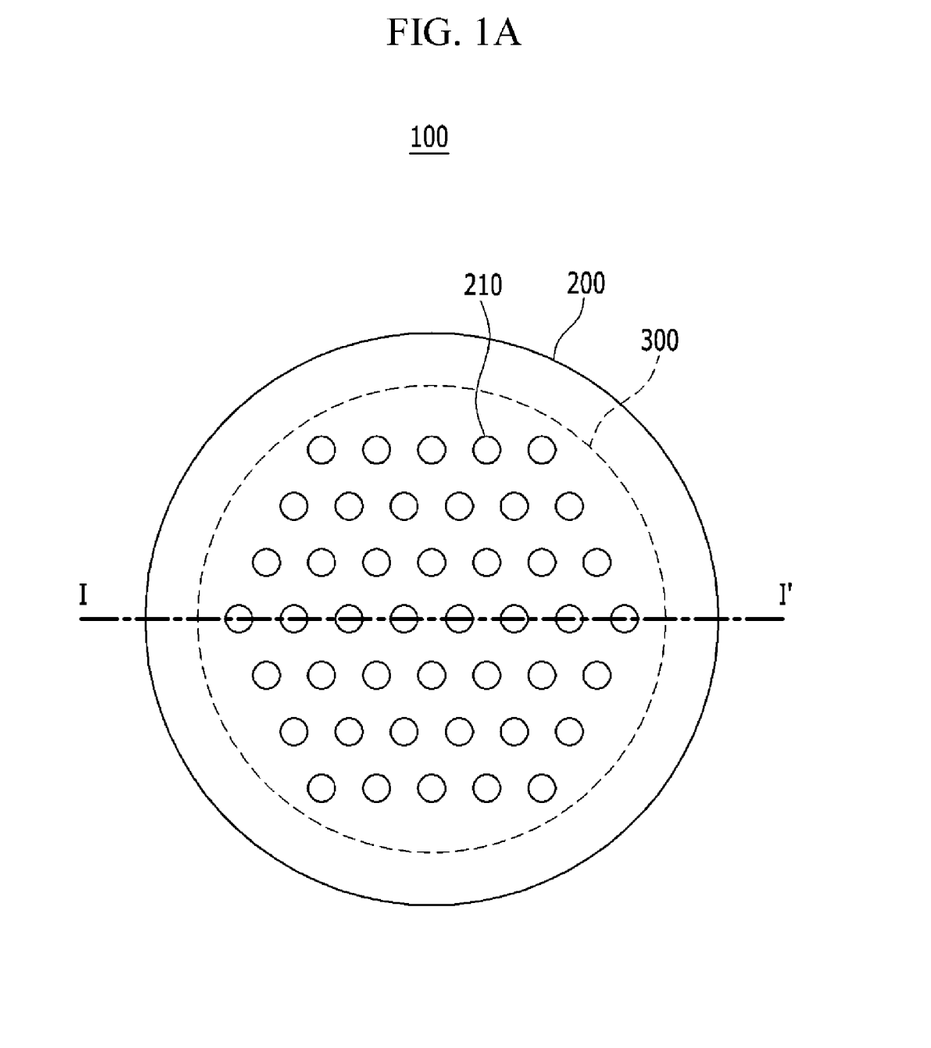
FIGS. 1A, 1B, and 1C are diagrams illustrating a piezoelectric element according to an exemplary embodiment of the present invention.
Figure 1B:
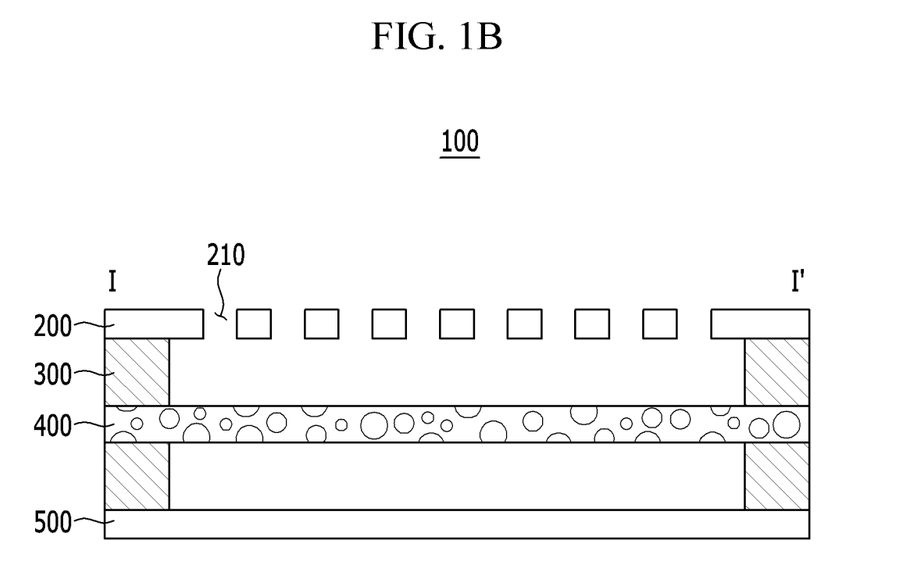
Figure 1C:
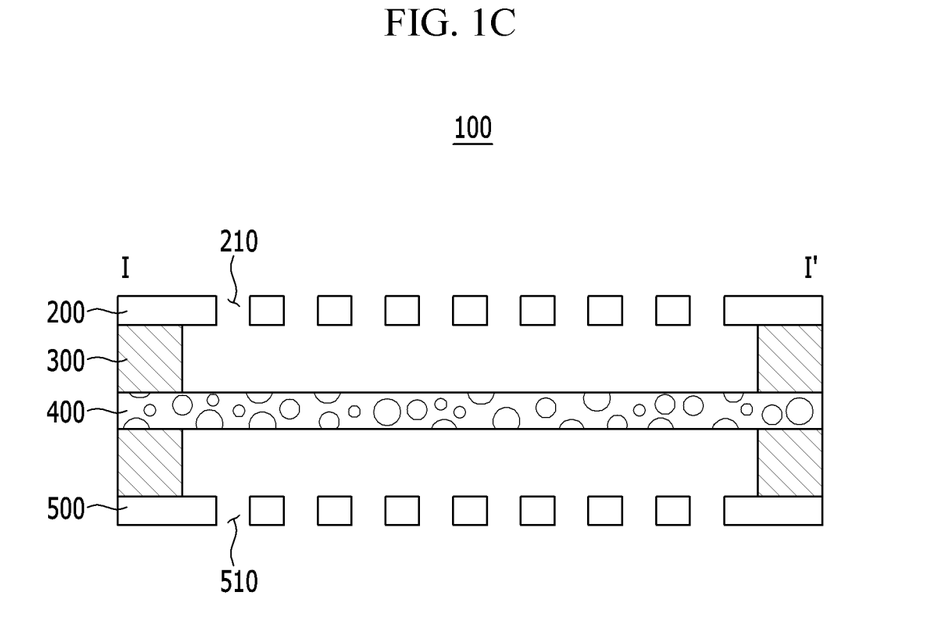

FIGS. 1A to 1C are diagrams illustrating a piezoelectric element according to an exemplary embodiment of the present invention. FIG. 1A is a plan view illustrating a piezoelectric element 100 and FIG. 1B is a cross-sectional view illustrating the piezoelectric element 100. FIG. 1C is a cross-sectional view illustrating the piezoelectric element 100 according to another exemplary embodiment of the present invention.

Referring to FIG. 1B, the piezoelectric element 100 according to an exemplary embodiment of the present invention includes an upper electrode 200, an insulator 300, a diaphragm 400, and a lower electrode 500.

The upper electrode 200 has acoustic transparency. The upper electrode 200 may include a plurality of openings 210 to acquire the acoustic transparency.

When the piezoelectric element 100 is operated as a microphone, an electrode corresponding to a direction in which a sound pressure is provided may include an opening to pass through the sound pressure applied to the diaphragm 400.

Figure 5:
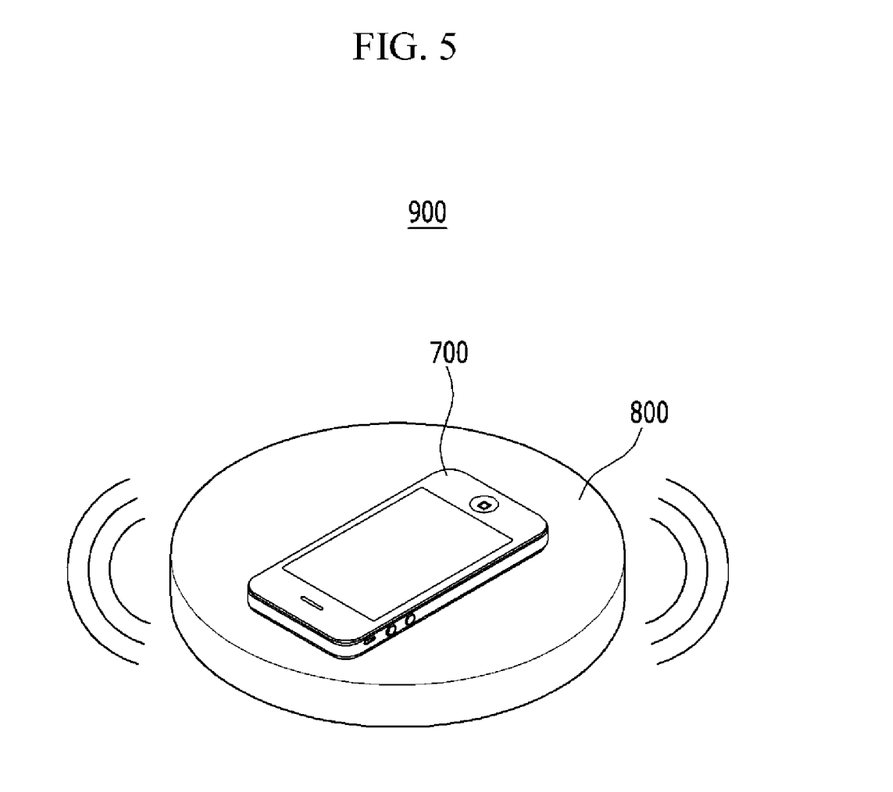
FIG. 5 is a diagram illustrating a wireless charging system according to an exemplary embodiment of the present invention.

The piezoelectric element 100 according to the exemplary embodiment of the present invention of FIG. 1B may be disposed on the charging target device 700 of FIG. 5 to apply the sound pressure onto the upper electrode 200 from sound, such as a user's voice.

When the piezoelectric element 100 is operated as a speaker, an electrode corresponding to a direction in which the sound pressure is radiated may include an opening to pass through the sound pressure generated by a vibration of the diaphragm 400.

The piezoelectric element 100 according to the exemplary embodiment of the present invention of FIG. 1B may be disposed in the charging target device 700 of FIG. 5 to pass through the negative pressure generated by the vibration of the diaphragm 400 through the upper electrode 200.

The diaphragm 400 is disposed between the upper electrode 200 and the lower electrode 500 and is formed of a mesoporous piezoelectric thin film, thus having several advantages.

When the piezoelectric element 100 serves as the speaker, polarization is increased and thus performance is improved. Further, flexibility is increased and acoustics may be more precisely controlled. In addition, when the diaphragm 400 is vibrated vertically, it may have a good restoring force.

In the case in which the piezoelectric element 100 serves as the microphone, the diaphragm 400 is vibrated vertically, the restoring force is good, and mechanical strength and stress may be controlled depending on a degree of porosity such that sensitivity of the microphone may be controlled.

When the piezoelectric element 100 serves as the charging element, unlike the existing piezoelectric material which generates a current only when strong physical pressure is applied, the mesoporous piezoelectric thin film may generate a current even when weak vibrations are applied to the piezoelectric element 100. Therefore, the charging target device 700 of FIG. 5, in which the piezoelectric element 100 is embedded, may use the existing design without needing to consider a special design for a charging mode, thereby providing considerable design advantages.

The upper electrode 200 and the diaphragm 400 are connected to each other through the insulator 300 and the lower electrode 500 and the diaphragm 400 are connected to each other through the insulator 300.

A first air gap is interposed between the upper electrode 200 and the diaphragm 400 and a second air gap is interposed between the lower electrode 500 and the diaphragm 400.

The air gaps may be formed to transfer the sound pressure to the diaphragm 400. The first air gap may be formed to correspond to the plurality of openings 210. The air gap may also be formed by etching a central portion of the insulator 300. Further, the air gap may be formed through the already formed annular insulator 300.

Mechanical sensitivity may be controlled at the time of an operation of the piezoelectric element 100 by controlling a size of the air gap.

When power is applied to piezoelectric element 100, the piezoelectric element 100 serves as one of a speaker or a microphone, and when the supply of power to the piezoelectric element 100 is blocked, the piezoelectric element 100 may serve as the charging element.

When the charging target device 700 of FIG. 5 in which the piezoelectric element 100 is embedded is a mobile terminal, generally, the time when the speaker and the microphone are not used is longer than the time when the speaker and the microphone are used.

When the piezoelectric element 100 serves as the charging element for a long period of time, the mobile terminal may acquire a considerable amount of charging power.

An exemplary embodiment of a control method for the piezoelectric element 100 to function as a speaker is as follows.

An AC voltage is applied to the upper electrode 200 and the lower electrode 500 and a DC voltage is applied to the diaphragm 400, thereby generating a corresponding sound pressure.

When an AC voltage is applied to the upper electrode 200 and the lower electrode 500 depending on the acoustic signal, the upper electrode 200 and the lower electrode 500 have a relative potential difference.

When a DC voltage is applied to the diaphragm 400 and an electrostatic force is applied to the diaphragm 400, the diaphragm 400 is pulled in one direction, towards the upper electrode 200 or the lower electrode 500.

This will be described below according to voltage polarity.

For example, when a positive voltage is applied to the diaphragm 400, a positive voltage is applied to the upper electrode 200, and a negative voltage is applied to the lower electrode 500, an electrostatic force is applied to the diaphragm 400 so that the diaphragm 400 is pulled in a direction of the lower electrode 500.

Further, when a positive voltage is applied to the diaphragm 400, a negative voltage is applied to the upper electrode 200, and a positive voltage is applied to the lower electrode 500, an electrostatic force is applied to the diaphragm 400 so that the diaphragm 400 is pulled in a direction of the upper electrode 200.

A vibration state (frequency, amplitude, phase) is determined depending on a displacement of the diaphragm 400 due to the electrostatic force and thus an acoustic wave is generated from the diaphragm 400. Therefore, the piezoelectric element 100 may serve as a speaker.

The exemplary embodiment of the control method for the piezoelectric element 100 to function as the microphone is as follows.

The DC voltage may be applied between at least one of the upper electrode 200 and the lower electrode 500 and the diaphragm 400 and the electrical signal corresponding to the sound pressure applied to the diaphragm 400 may be generated.

The upper electrode 200 and the diaphragm 400 may form a first capacitive element and the lower electrode 500 and the diaphragm 400 may form a second capacitive element.

When the piezoelectric element 100 according to the present invention serves as the microphone, the acoustic signal may be detected depending on a change in capacitance of at least one of the first capacitive element and the second capacitive element.

When only the first capacitive element is used for the function of the microphone, the lower electrode 500 may be configured not to be electrically used and when only the second capacitive element is used, the upper electrode 200 may be configured not to be electrically used.

When both of the first capacitive element and the second capacitive element are used as a capacitance detection target, both of the upper electrode 200 and the lower electrode 500 may be included in an electrical configuration.

Therefore, the piezoelectric element 100 may serve as the microphone.

The exemplary embodiment of the control method for the piezoelectric element 100 to function as the charging element will be described in detail with reference to an exemplary embodiment of FIG. 3.

Referring to FIG. 1C, the piezoelectric element 100 according to an exemplary embodiment of the present invention includes the lower electrode 500 having acoustic transparency.

When comparing with FIG. 1B, the exemplary embodiment of FIG. 1C is only different from a structure of the lower electrode 500 of FIG. 1B and therefore the lower electrode 500 will be mainly described. Other components of the piezoelectric element 100 and a method for operating the piezoelectric element 100 are based on the same principle as the exemplary embodiment of FIG. 1B and therefore the description thereof will be omitted.

The lower electrode 500 may have a plurality of openings 510 to acquire acoustic transparency.

According to the exemplary embodiment of FIG. 1C, when the piezoelectric element 100 is operated as the microphone, the upper electrode 200 and the lower electrode 500 may allow the sound pressure generated by the user voice to pass through the plurality of openings 210 and 510.

According to the exemplary embodiment of FIG. 1C, when the piezoelectric element 100 is operated as the speaker, the upper electrode 200 and the lower electrode 500 may pass the sound pressure generated by the vibration of the diaphragm 400 through the plurality of openings 210 and 510.

Figure 2:
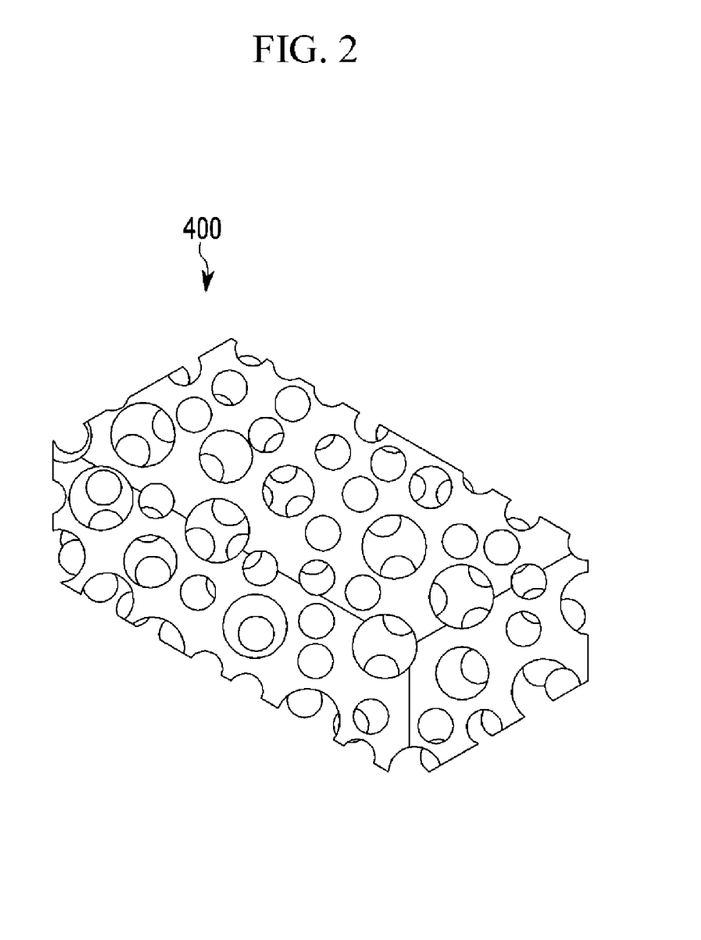
FIG. 2 is a perspective view of a mesoporous piezoelectric thin film according to an exemplary embodiment of the present invention.

FIG. 2 is a perspective view of a mesoporous piezoelectric thin film.

The mesoporous piezoelectric thin film may be a mesoporous PVDF thin film.

The mesoporous PVDF thin film means that a thin film made of a polyvinylidene fluoride (PVDF) material is configured to include a plurality of pores. Generally, the mesoporous PVDF thin film may be similar to a sponge in form (see FIG. 2). The diameters of the plurality of pores can be between several nm and several hundred nm, and are desired to be as small as possible.

The mesoporous PVDF thin film may be produced by casting a PVDF/ZnO suspension to generate a PVDF/ZnO composite and acid etching a PVDF/ZnO composite.

In the present invention, the mesoporous form of the piezoelectric thin film is important, and therefore the manufacturing method thereof is not limited.

The fact that only a weak vibration is applied to the mesoporous PVDF thin film to generate a current is disclosed in a paper (Advanced Energy Materials Volume 4, Issue 7, May 13 2014, Sponge-Like Piezoelectric Polymer Films for Scalable and Integratable Nanogenerators and Self-Powered Electronic Systems).

Figure 3:
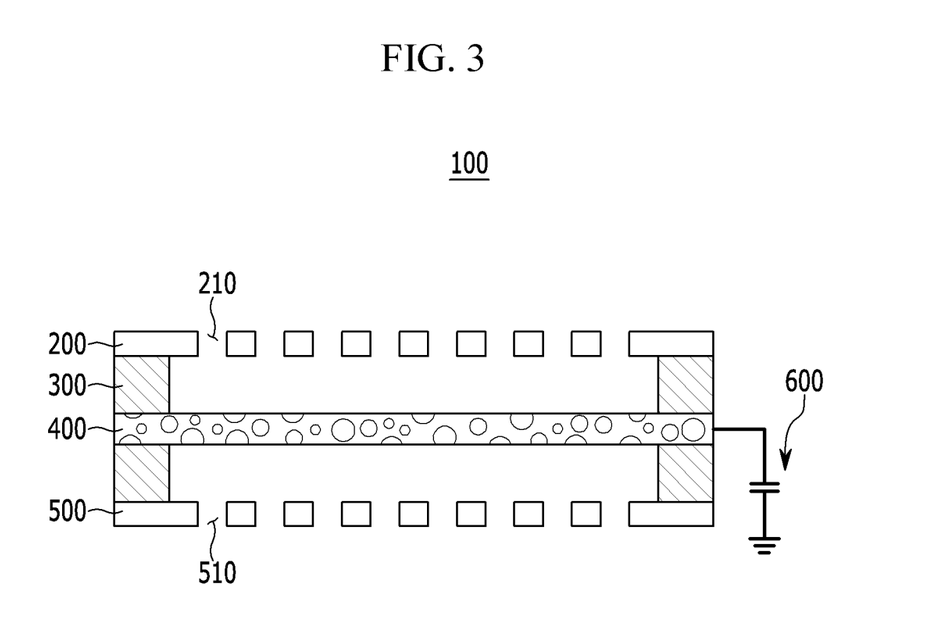
FIG. 3 is a diagram illustrating a connection relationship between a piezoelectric element and a capacitive element according to an exemplary embodiment of the present invention.

FIG. 3 is a diagram illustrating a connection relationship between a piezoelectric element and a capacitive element.

The piezoelectric element 100 may further include the capacitive element 600 of which the one terminal is electrically connected to the diaphragm 400.

When the piezoelectric element 100 is embedded in the charging target device 700 of FIG. 5, the capacitive element 600 may not necessarily be a component of the piezoelectric element 100, but rather may be a component of the charging target device 700 itself.

The capacitive element 600 is illustrated as a capacitor type in FIG. 3, which is to describe an accumulation of charge. Here, the capacitive element 600 may be a capacitor which is configured of a plurality of battery cells.

The other terminal of the capacitive element 600 may be a ground. The other terminal of the capacitive element 600 may be electrically connected to one of the upper electrode 200 and the lower electrode 500.

In the present invention, unless an electrical "connection" between two elements is clearly described as "direct connection", it means that the two elements may be connected to each other by interposing other elements between the two elements as well as the two elements may be directly connected to each other by an electric wire.

Other elements may be an inductor, a capacitor, a resistor, a transistor, and the like. Other elements serve as switching functions, filter functions, and the like, depending on a control signal, and thus may provide a beneficial effect to a circuit.

As described above, the diaphragm 400 according to the exemplary embodiment of the present invention is configured of the mesoporous piezoelectric thin film, which may generate a current by applying only a weak vibration to the piezoelectric element 100.

Therefore, the diaphragm 400 generates a current corresponding to a vibration such that the piezoelectric element 100 may serve as the charging element.

In this case, the capacitive element 600 may serve to store the corresponding current.

Figure 4A:
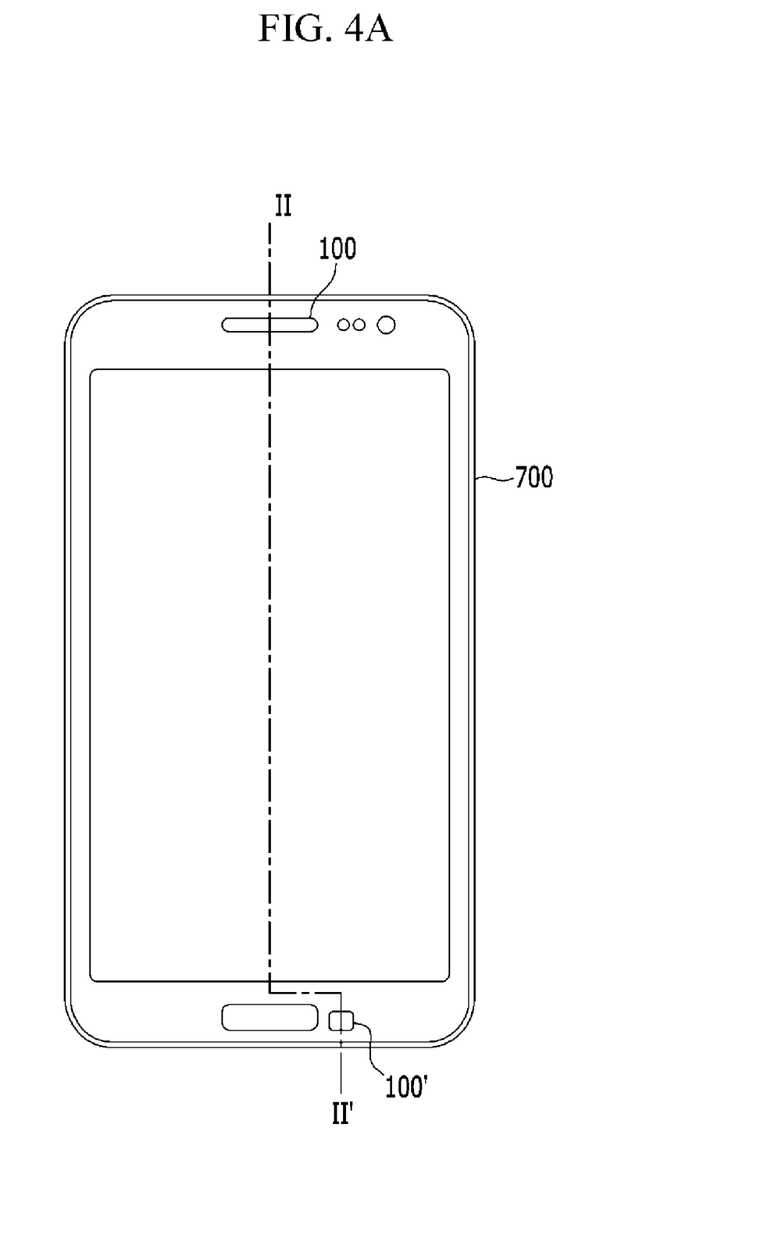
FIGS. 4A and 4B are diagrams illustrating a charging target device in which the piezoelectric element is mounted according to one or more exemplary embodiments of the present invention.
Figure 4B:
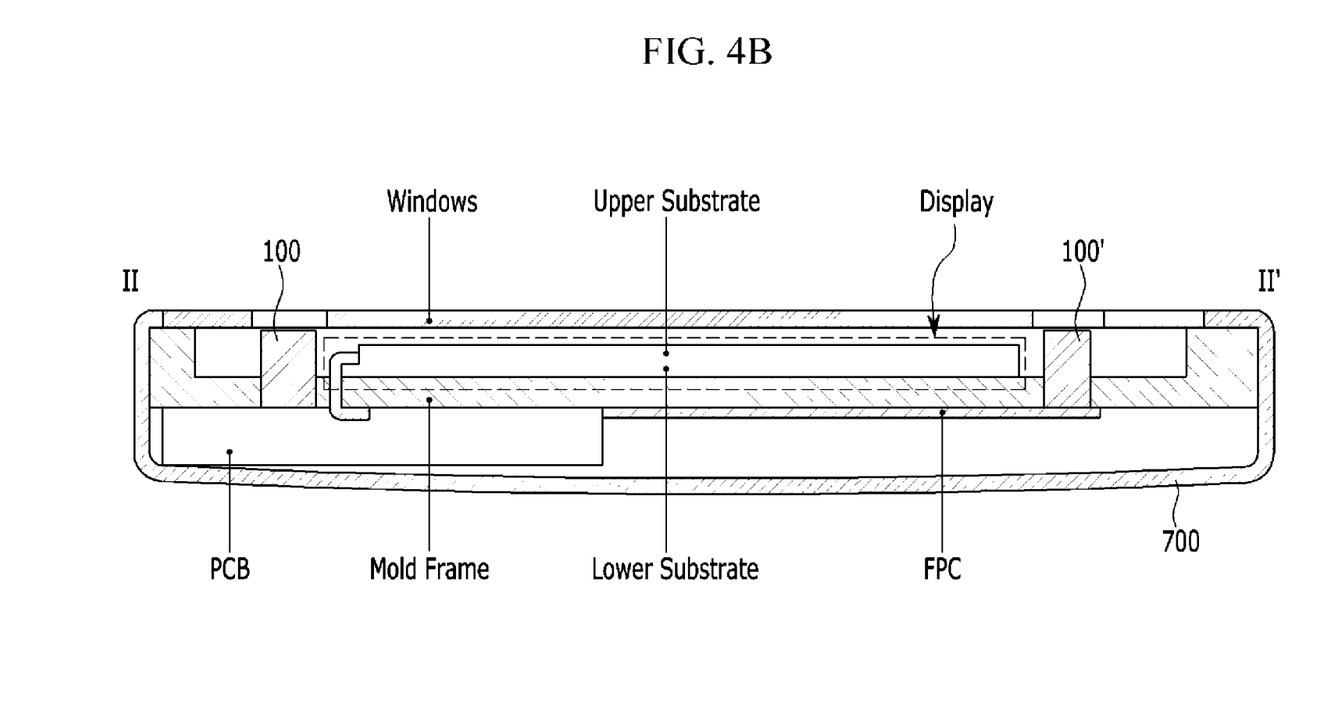

FIGS. 4A and 4B are diagrams illustrating a charging target device 700 in which the piezoelectric element is mounted.

FIG. 4A is a front view of the charging target device 700 when the charging target device 700 is a mobile device, and FIG. 4B is a cross-sectional view of the charging target device 700.

Referring to FIGS. 4A and 4B, piezoelectric elements 100 and 100' according to the exemplary embodiment of the present invention are disposed in the charging target device 700.

According to the related art, a speaker element is present at a place where the piezoelectric element 100 is positioned and a microphone element is present at a place where the piezoelectric element 100' is positioned.

However, according to exemplary embodiments of the present invention, as illustrated in FIGS. 4A and 4B, the piezoelectric elements 100 and 100' may also be operated as a plurality of speakers or a plurality of microphones, thereby creating various acoustic effects.

FIG. 5 is a diagram illustrating a wireless charging system according to an exemplary embodiment of the present invention.

Referring to FIG. 5, a wireless charging system according to an exemplary embodiment of the present invention includes the charging target device 700 and a charging device 800.

The charging target device 700 includes the piezoelectric element 100 which includes the diaphragm 400 configured of the mesoporous piezoelectric thin film described above.

The charging device 800 may also be configured as any device which may generate a vibration. Home appliances which generate a vibration, for example, a refrigerator, a desktop computer, an air conditioner, and the like may serve as the charging device 800.

The charging device 800 may be a dedicated charging device in which an oscillator is embedded. The charging device 800 may be configured to have a vibration state (frequency, amplitude, and phase) changed depending on a control signal.

The piezoelectric element 100 generates a current by the vibration generated by the charging device 800 and the charging target device 700 is charged using the current.

Compared with the existing wireless charging methods using magnetic force, a wireless charging system 900 may be harmless to the human body and may not require separate power consumption, depending on the charging device 800.

The piezoelectric element 100 may be configured as described above.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A wireless charging system, comprising:
a charging target device including a piezoelectric element which includes a diaphragm consisting of a mesoporous piezoelectric thin film; and
a charging device generating a vibration,
wherein the piezoelectric element generates a current by the vibration, and
the charging target device is configured to charge using the current; wherein:
the piezoelectric element further includes
an upper electrode having acoustic transparency, and
a lower electrode, and
the diaphragm is disposed between the upper electrode and the lower electrode, and
the upper electrode, the lower electrode, and the diaphragm are electrically insulated from one another.

2. The wireless charging system of claim 1, wherein:
the mesoporous piezoelectric thin film consists of a mesoporous polyvinylidene fluoride (PVDF) thin film.

3. The wireless charging system of claim 1, wherein:
the lower electrode has acoustic transparency.

4. The wireless charging system of claim 1, wherein:
the upper electrode forms a plurality of openings to provide the acoustic transparency.

5. The wireless charging system of claim 1, wherein:
the piezoelectric element forms a first air gap interposed between the upper electrode and the diaphragm, and a second air gap interposed between the diaphragm and the lower electrode.

6. The wireless charging system of claim 1, wherein:
the piezoelectric element is configured to operate as one of a speaker or a microphone when power is applied to the piezoelectric element, and the piezoelectric element is configured to operate as a charging element when power to the piezoelectric element is blocked.

7. The wireless charging system of claim 6, wherein:
an AC voltage is applied to the upper electrode and the lower electrode, and a DC voltage is applied to the diaphragm to generate a sound pressure.

8. The wireless charging system of claim 6, wherein:
a DC voltage is applied to at least one of the upper electrode and the lower electrode and the diaphragm, and an electrical signal corresponding to a sound pressure applied to the diaphragm is generated.

9. The wireless charging system of claim 1, wherein:
the upper electrode and the diaphragm are configured to form a first capacitive element, the lower electrode and the diaphragm are configured to form a second capacitive element, and the piezoelectric element is configured to detect an acoustic signal by detecting a change in capacitance of at least one of the first capacitive element and the second capacitive element.

10. The wireless charging system of claim 1, wherein:
the diaphragm is configured to generate a current corresponding to a received vibration.

11. The wireless charging system of claim 1, further comprising:
a capacitive element comprising one terminal electrically connected to the diaphragm.

12. The wireless charging system of claim 1, wherein:
the charging device comprises a home appliance.

13. The wireless charging system of claim 12, wherein:
the home appliance comprises a refrigerator, a desktop computer, or an air conditioner.

14. A wireless charging system, comprising:
a charging target device including a piezoelectric element which includes a diaphragm consisting of a mesoporous polyvinylidene fluoride thin film; and
a charging device generating a vibration,
wherein the piezoelectric element generates a current by the vibration, and
the charging target device is configured to charge using the current; wherein:
the piezoelectric element further includes
an upper electrode having acoustic transparency, and
a lower electrode, and
the diaphragm is disposed between the upper electrode and the lower electrode, and
the upper electrode, the lower electrode, and the diaphragm are electrically insulated from one another.

* * * * *